United States Patent
Hopkins et al.

(10) Patent No.: US 11,562,773 B2
(45) Date of Patent: Jan. 24, 2023

(54) METAL-CONTAINING STRUCTURES, AND METHODS OF TREATING METAL-CONTAINING MATERIAL TO INCREASE GRAIN SIZE AND/OR REDUCE CONTAMINANT CONCENTRATION

(71) Applicant: Micron Technology, Inc., Boise, ID (US)

(72) Inventors: John D. Hopkins, Meridian, ID (US); Jordan D. Greenlee, Boise, ID (US); Peng Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 16/585,346

(22) Filed: Sep. 27, 2019

(65) Prior Publication Data

US 2021/0098028 A1    Apr. 1, 2021

(51) Int. Cl.
| | |
|---|---|
| *C23C 8/06* | (2006.01) |
| *G11C 5/06* | (2006.01) |
| *H01L 27/11524* | (2017.01) |
| *H01L 27/11556* | (2017.01) |
| *H01L 27/11582* | (2017.01) |
| *H01L 27/1157* | (2017.01) |
| *H01L 27/11573* | (2017.01) |
| *H01L 27/11529* | (2017.01) |
| *C23C 8/36* | (2006.01) |
| *C23C 28/00* | (2006.01) |

(52) U.S. Cl.
CPC ............... *G11C 5/063* (2013.01); *C23C 8/06* (2013.01); *C23C 8/36* (2013.01); *C23C 28/322* (2013.01); *C23C 28/34* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 10,043,571 B1 * | 8/2018 | Liaw | G11C 11/417 |
| 2007/0292604 A1 * | 12/2007 | Dordi | C23C 18/1851 |
| | | | 427/99.5 |
| 2017/0062218 A1 * | 3/2017 | Duan | C23C 16/26 |
| 2017/0243918 A1 * | 8/2017 | Terai | G11C 13/0002 |
| 2018/0261616 A1 * | 9/2018 | Cho | H01L 27/11582 |

\* cited by examiner

*Primary Examiner* — Shamim Ahmed
*Assistant Examiner* — Bradford M Gates
(74) *Attorney, Agent, or Firm* — Wells St. John P.S.

(57) ABSTRACT

Some embodiments include a method of forming a conductive structure. A metal-containing conductive material is formed over a supporting substrate. A surface of the metal-containing conductive material is exposed to at least one radical form of hydrogen and to at least one oxidant. The exposure alters at least a portion of the metal-containing conductive material to thereby form at least a portion of the conductive structure. Some embodiments include a conductive structure which has a metal-containing conductive material with a first region adjacent to a second region. The first region has a greater concentration of one or both of fluorine and boron relative to the second region.

4 Claims, 16 Drawing Sheets

METAL-CONTAINING STRUCTURES, AND METHODS OF TREATING METAL-CONTAINING MATERIAL TO INCREASE GRAIN SIZE AND/OR REDUCE CONTAMINANT CONCENTRATION

TECHNICAL FIELD

Integrated assemblies. Metal-containing structures (e.g., wordlines and bitlines). Methods of treating metal-containing material to increase grain size and/or reduce contaminant concentration.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to have high-conductivity (low resistance) within various conductive structures (e.g., wordlines and bitlines) of the three-dimensional NAND assemblies (arrangements, devices). It would be desirable to develop methods of increasing conductivity within such conductive structures. It would also be desirable for such methods to be generally applicable to conductive structures (e.g., wordlines and bitlines) of integrated circuitry (e.g., logic, memory, sensors, etc.).

DETAILED DESCRIPTION OF THE ILLUSTRATED EMBODIMENTS

Some embodiments include metal-containing structures (e.g., wordlines, bitlines, etc.) having at least two regions which are different from one another relative to crystallinity and/or contaminant concentration. Some embodiments include methods in which metal-containing material is exposed to at least one oxidant and at least one form of hydrogen radical. The exposure may increase grain size of a region of the metal-containing material, and/or may reduce contaminant concentration (e.g., fluorine concentration, boron concentration, chlorine concentration, carbon concentration, silicon concentration, germanium concentration, oxygen concentration, etc.) within a region of the metal-containing material. Example embodiments are described with reference to FIGS. 5-17.

Figure 1:
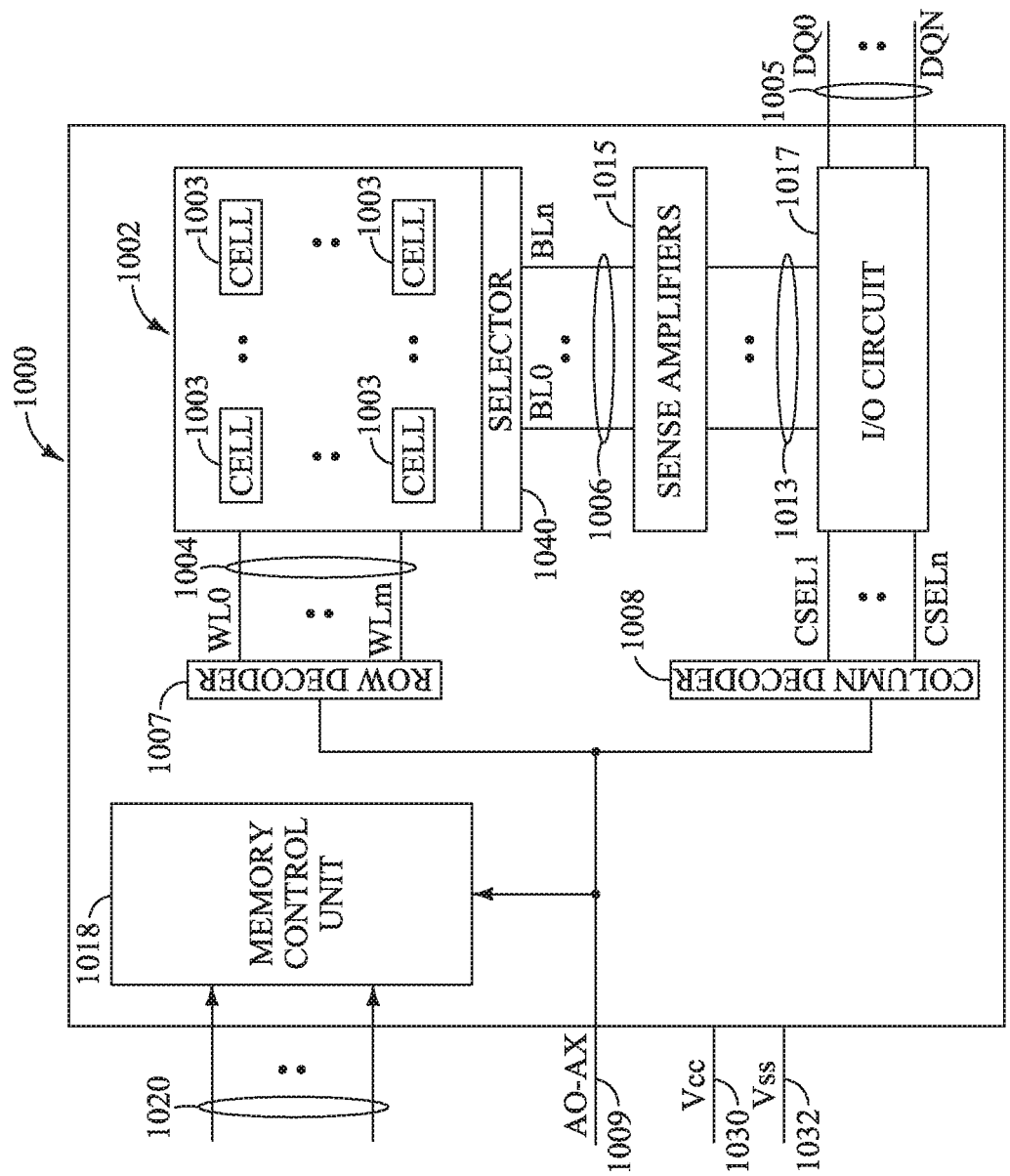
FIG. 1 shows a block diagram of a prior art memory device having a memory array with memory cells.
Figure 2:
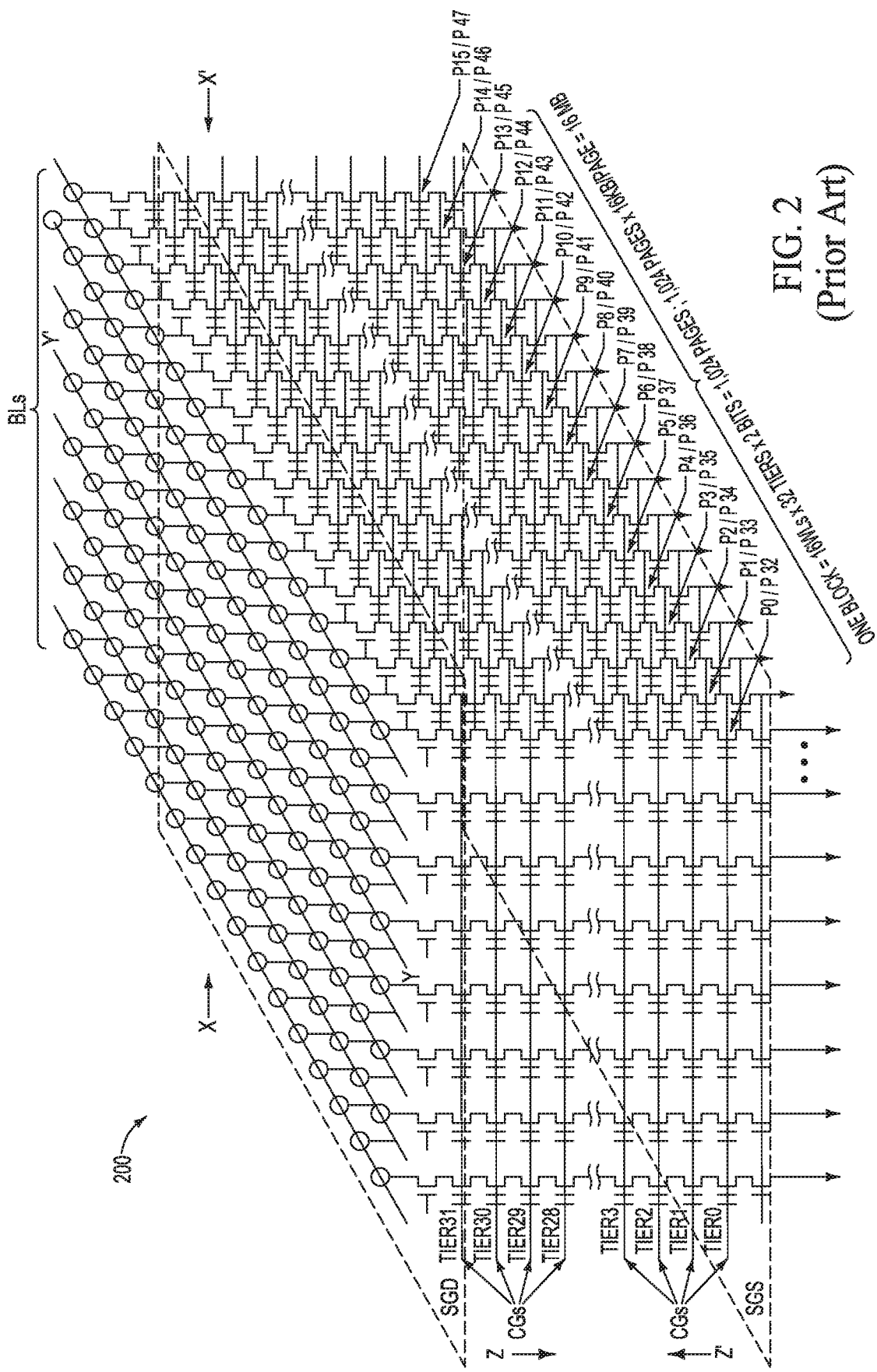
FIG. 2 shows a schematic diagram of the prior art memory array of FIG. 1 in the form of a 3D NAND memory device.
Figure 3:
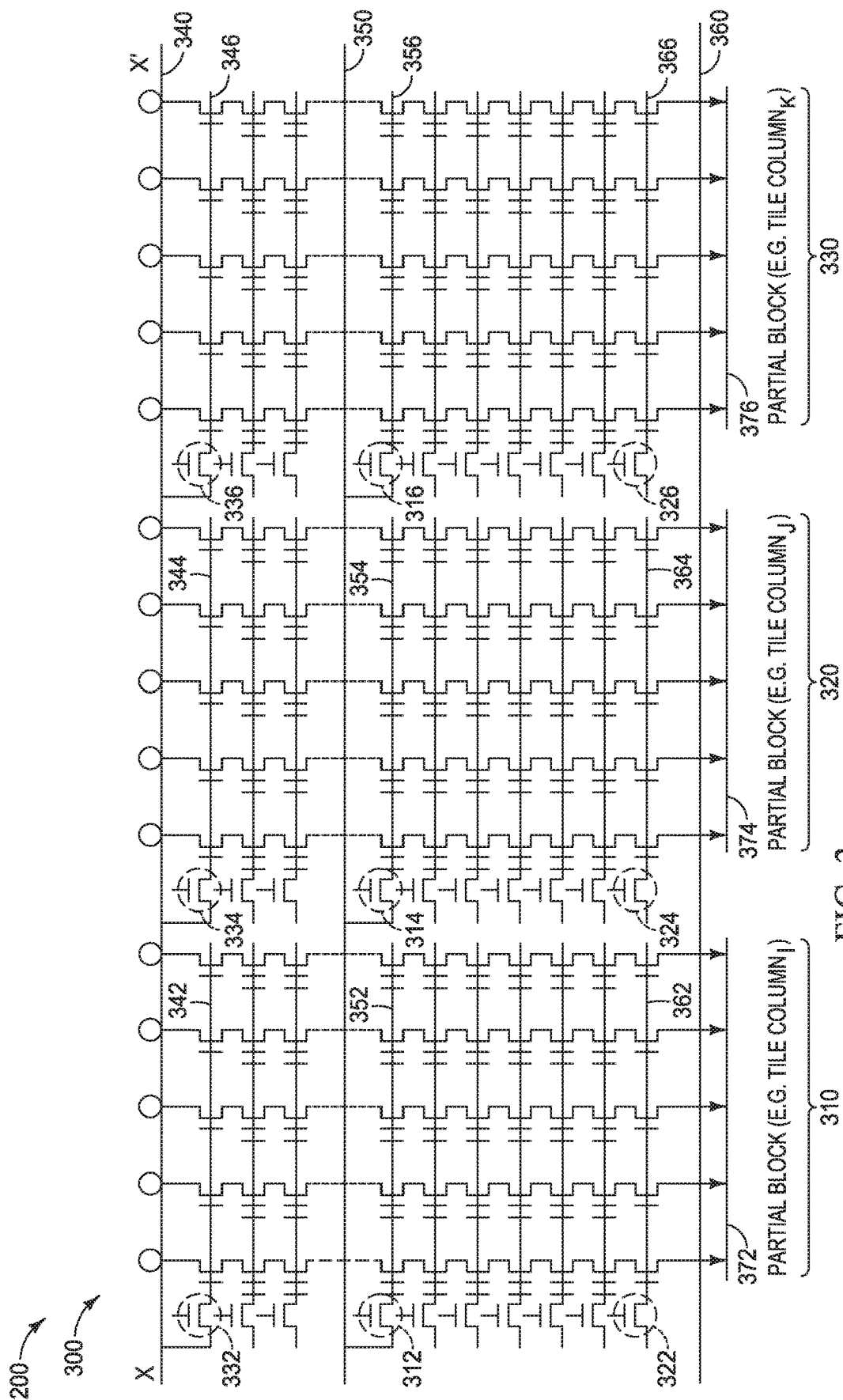
FIG. 3 shows a cross-sectional view of the prior art 3D NAND memory device of FIG. 2 in an X-X' direction.
Figure 4:
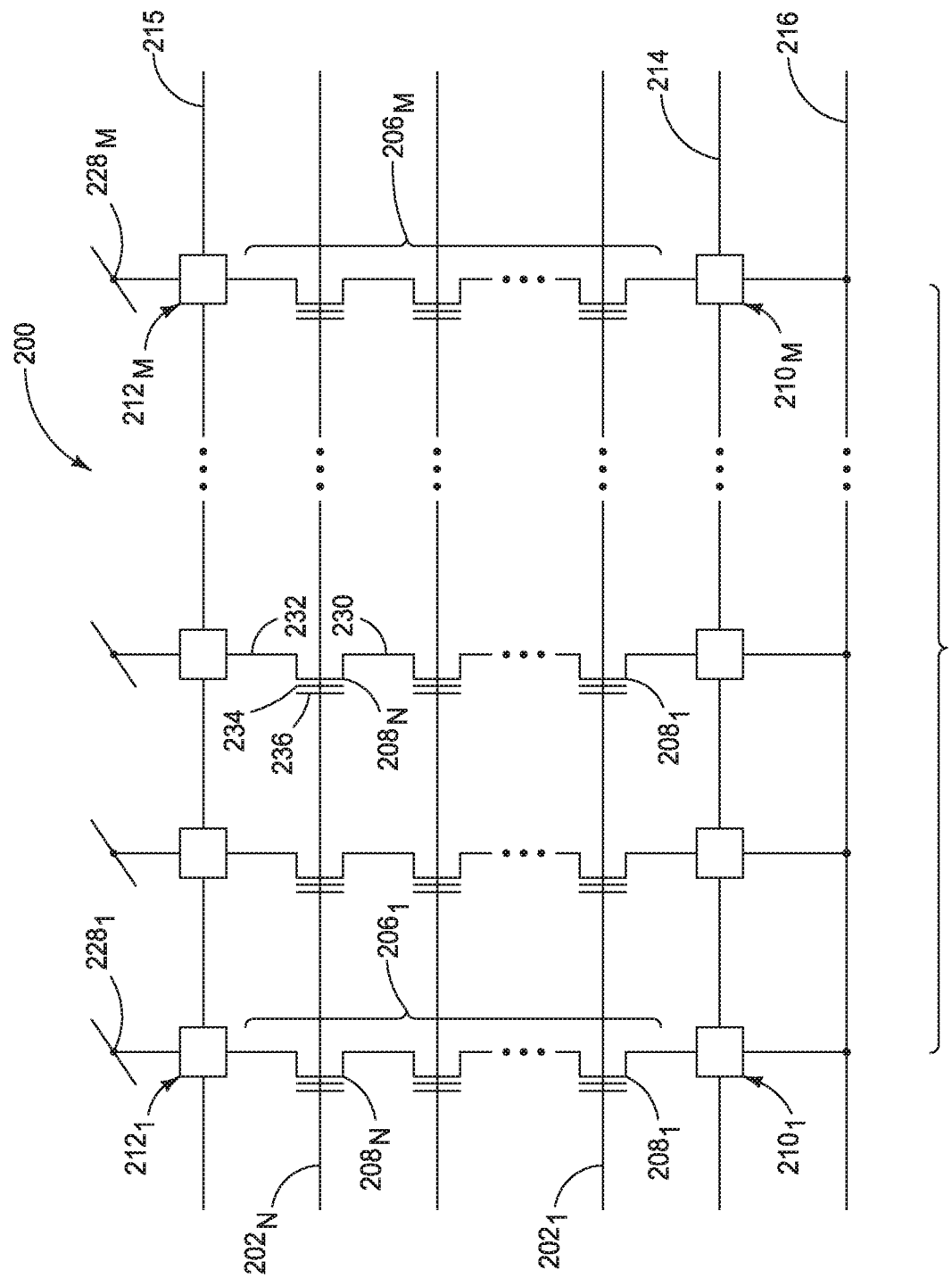
FIG. 4 is a schematic diagram of a prior art NAND memory array.
Figure 5:
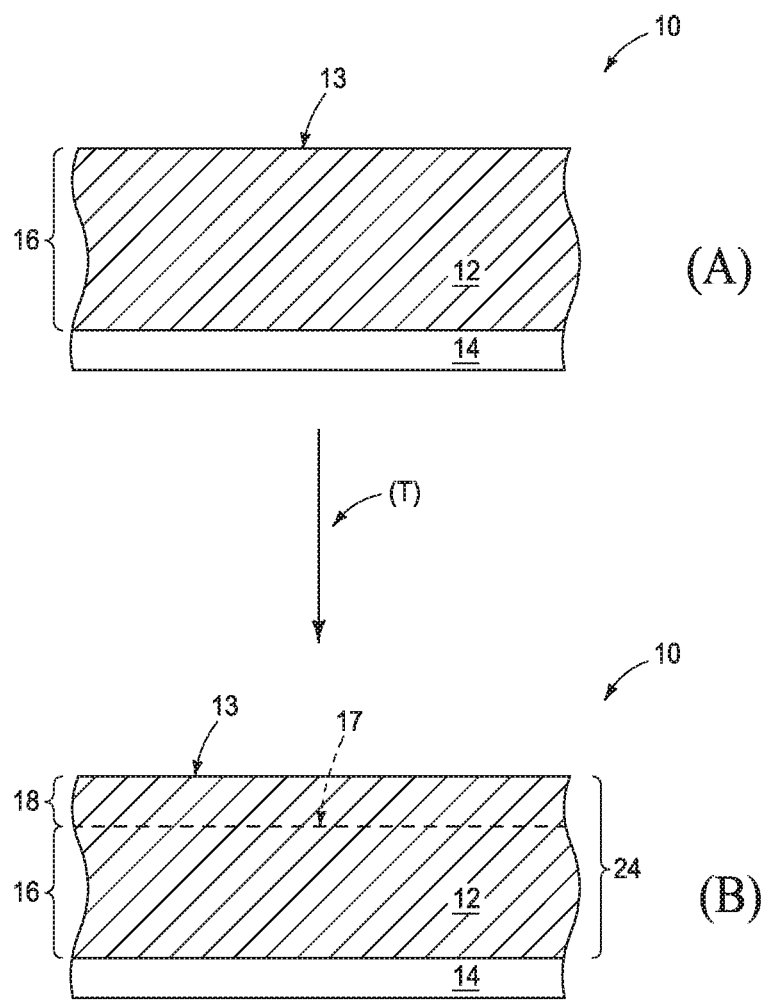
FIG. 5 shows diagrammatic cross-sectional side views of a portion of an integrated assembly being processed in accordance with an example embodiment.

FIG. 5 shows an integrated assembly (structure, construction, device, arrangement, etc.) 10 being transitioned from a first process stage (A) to a second process stage (B) through a treatment (T).

Referring to the first process stage (A), the assembly 10 includes a metal-containing conductive material 12 over a supporting substrate 14.

The metal-containing conductive material 12 may include one or more of tungsten, titanium, cobalt, nickel, molybdenum, niobium, ruthenium, tantalum, copper and aluminum. In some embodiments, the metal-containing material 12 may consist essentially of, or consist of metal. The metal may be elemental (pure, single-element metal), or may be a mixture (e.g. alloy) of two or more metals. In some embodiments, the metal-containing material may comprise a mixture of metal with one or more non-metal elements. The non-metal elements may include, for example, one or more of nitrogen, silicon, boron, carbon and germanium. Accordingly, in some embodiments the metal-containing material 12 may comprise one or more of metal nitride, metal silicide, metal boride, metal carbide and metal germanide. In some embodiments, the metal-containing material may include one or more minor contaminants (e.g., may include one or both of fluorine and boron). It is noted that boron is listed as both a potential non-metal component of the conductive material 12 and as a potential contaminant. The determination of whether the boron is a component of the conductive material 12 or a contaminant is predicated upon whether the boron is desired within the material 12 to the concentration found in the material, or not.

The supporting structure 14 may comprise a semiconductor substrate, and may comprise insulative material (e.g., silicon nitride, silicon dioxide, etc.) directly adjacent the metal-containing material 12. Specifically, the supporting structure 14 may comprise an insulative material (e.g., silicon dioxide) over a semiconductor material (e.g., silicon). The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the supporting structure (base) 14 may correspond to a semiconductor substrate containing one or more materials associated with integrated circuit fabrication. Such materials may include, for example, one or more of refractory metal materials, barrier materials, diffusion materials, insulator materials, etc.

The process stage (A) has the metal-containing material 12 as a single region 16. The metal-containing material 12 has a substantially homogeneous composition throughout the single region 16.

The assembly 10 is subjected to the treatment (T) to alter at least a portion of the metal-containing material 12 and thereby transition the assembly 10 to the second process stage (B). In the illustrated embodiment, an upper region 18 of the metal-containing material 12 is altered. A dashed line 17 is provided to diagrammatically illustrate an approximate boundary between the regions 16 and 18. The boundary indicated by the dashed line 17 may be an abrupt boundary or may be a gradient.

The altered region 18 may comprise a reduced concentration of one or more contaminants as compared to the region 16. For instance, the altered region 18 may comprise a lower concentration of one or both of fluorine and boron relative to the region 16. Additionally, or alternatively, the altered region 18 may comprise a different crystallinity than the region 16. For instance, the altered region 18 may comprise a larger grain size than the region 16.

The regions 16 and 18 may be together considered to form a conductive structure 24.

Figure 6:
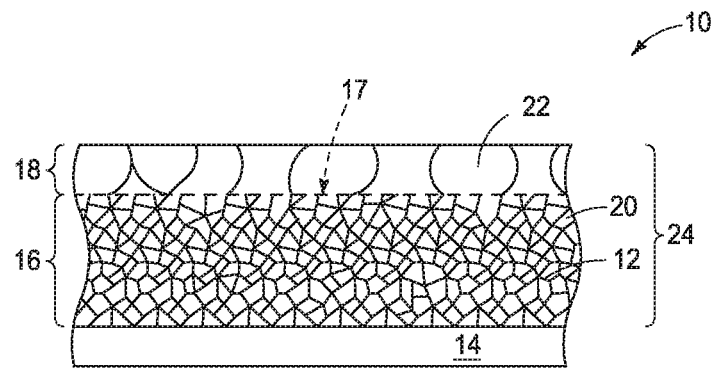
FIG. 6 is a diagrammatic cross-sectional side view of a portion of an integrated assembly in accordance with an example embodiment.

FIG. 6 diagrammatically illustrates a configuration of the assembly 10 in which the region 18 comprises a larger grain size than the region 16. Specifically, crystalline grains 20 (only one of which is labeled) are diagrammatically illustrated within the region 16, and crystalline grains 22 (only one of which is labeled) are diagrammatically illustrated within the region 18. The crystalline grains 22 are larger than the crystalline grains 20. In some embodiments, the crystalline grains 22 may be at least about 10% larger than the crystalline grains 20, at least about 50% larger than the crystalline grains 20, at least about twice as large as the crystalline grains 20, at least about 10 times larger than the crystalline grains 20, etc. The grain sizes may be quantitated as an average grain size per unit area, as will be recognized by persons of ordinary skill in the art. The cross-hatching of the conductive material 12 is not shown in FIG. 6 in order to simplify the drawing.

Figure 7:
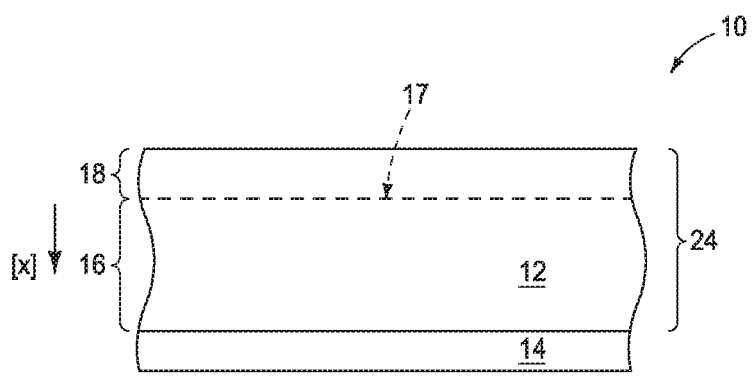
FIG. 7 is a diagrammatic cross-sectional side view of a portion of an integrated assembly in accordance with an example embodiment.

FIG. 7 diagrammatically illustrates a configuration of assembly 10 in which the region 18 has a lower concentration of a contaminant (X) than the region 16. The cross-hatching of the conductive material 12 is not shown in FIG. 7 in order to simplify the drawing.

The contaminant concentration (represented as [X] in FIG. 7) is shown to increase from the boundary 17 into the region 16. The contaminant may include, for example, one or both of fluorine and boron. The contaminant concentration within the region 16 may be at least about 10% higher than within the region 18, at least about 50% higher than within the region 18, at least about twice as high as within the region 18, at least about 10 times as high as within the region 18, etc. The contaminant concentration may be expressed as an amount of contaminant per unit volume; and in some embodiments may be expressed as an atomic percent. In some embodiments, the contaminant concentration within the region 18 may be so low as to be undetectable.

In some embodiments, the contaminant may include fluorine, and may be present in the unaltered region 16 to a concentration of at least about 1 atomic percent, 2 atomic percent, 10 atomic percent, 20 atomic percent, etc.; and may be present in the altered region 18 to a concentration of less than or equal to about 1 atomic percent, less than or equal to about 0.5 atomic percent, less than or equal to about 0.25 atomic percent, etc.

In some embodiments, the contaminant may include boron, and may be present in the unaltered region 16 to a concentration of at least about 1 atomic percent, 2 atomic percent, 10 atomic percent, 20 atomic percent, etc.; and may be present in the altered region 18 to a concentration of less than or equal to about 1 atomic percent, less than or equal to about 0.5 atomic percent, less than or equal to about 0.25 atomic percent, or even to a concentration which is essentially undetectable.

The reduction in contaminant concentration within the region 18 and/or the increase in grain size within the region 18 may improve the overall conductivity of the conductive structure 24. Such can improve operational characteristics of the conductive structure 24 for integrated architectures. For instance, the conductive structure 24 may be incorporated into wiring, interconnects, components, etc., of an integrated assembly. In some embodiments, the conductive structure 24 may be incorporated into bitlines and/or wordlines.

The treatment (T) of FIG. 5 may include exposure of the metal-containing material 12 to both oxidant and reductant. The oxidant converts a region of the metal-containing material 12 to metal oxide, and then the reductant converts the metal oxide back to a non-oxidized form of the metal-containing material. The repeated oxidation and reduction may lead to grain growth within the metal-containing material, and/or may lead to out-migration of contaminants from the metal-containing material.

In some embodiments, the reductant utilized for the treatment (T) may include at least one radical form of hydrogen (e.g., may include one or more of H., $H_2^+$, and $H_2^-$); and in some embodiments the reductant may comprise, consist essentially of, or consist of H.. The radical forms of hydrogen may be generated by a plasma. The plasma may be remote relative to the assembly 10. In other words, the plasma may be operated under conditions such that the assembly 10 is not directly exposed to the plasma, and instead the hydrogen radicals generated by the plasma are transported from the plasma to the assembly 10.

In some embodiments, the oxidant utilized for the treatment (T) may include one or more of $O_2$ (diatomic oxygen), $O_3$ (ozone), $H_2O_2$ (hydrogen peroxide), and perchlorate ion; and in some embodiments the oxidant may comprise, consist essentially of, or consist of one or both of $O_2$ and $O_3$.

The treatment (T) exposes an upper surface 13 of the assembly 10 to the reductant and oxidant. In some embodiments, such upper surface may be maintained at a temperature within a range of from about 100° C. to about 1000° C. for a time of from about 10 seconds to about 100 minutes during such treatment. The treated surface may be within an ambient which has a pressure of less than or equal to atmospheric pressure (i.e., a pressure of less than or equal to about one atmosphere).

Figure 8:
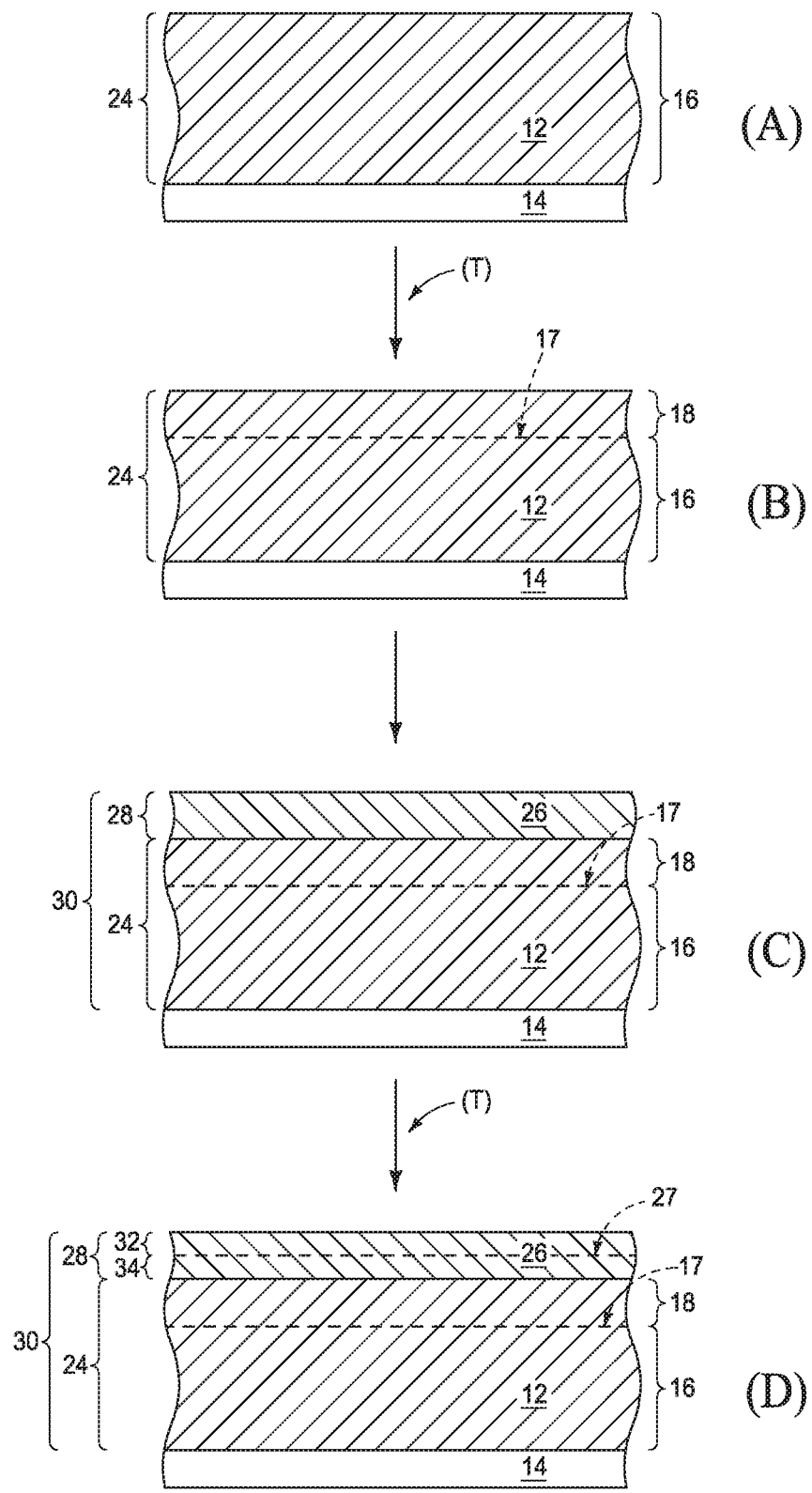
FIG. 8 shows diagrammatic cross-sectional side views of a portion of an integrated assembly being processed in accordance with an example embodiment.

In some embodiments, the conductive structure 24 may comprise multiple conductive materials, with one or more of such conductive materials having been treated in accordance with the treatment conditions (T) of FIG. 5. For instance, FIG. 8 shows the integrated assembly 10 comprising the conductive material 12 as a first conductive material, and comprising a second conductive material 26 formed over the first conductive material. The first conductive material 12 is transitioned from the first process stage (A) to the second process stage (B) through the treatment (T); with such treatment being identical to that described above with reference to FIG. 5. The conductive material 12 comprises the first and second regions 16 and 18 at the process stage (B), with the region 18 being altered relative to the region 16 (e.g., comprising less contaminant than the region 16 and/or comprising different crystallinity than the region 16).

The process stage (B) is transitioned to a process stage (C) by forming the second conductive material 26 over the conductive structure 24. The second conductive material 26 may be considered to represent a second conductive structure 28 which is formed directly against the altered region 18 of the first conductive structure 24. In some embodiments, the first and second conductive structures 24 and 28 may be considered together to form a third conductive structure 30.

The second conductive material 26 may be a second metal-containing material; and may comprise one or more of the substances described above as being suitable for utilization in the first metal-containing material 12. The second metal-containing material 26 may be compositionally different relative to the first metal-containing material 12, or may be compositionally the same as the first metal-containing material 12.

The second metal-containing material 26 is subjected to the treatment (T) to form an altered upper region 32 of the second metal-containing material 26 over an unaltered lower region 34 of the second metal-containing material 26. A dashed line 27 is provided to illustrate an approximate boundary between the regions 32 and 34. The altered region 32 may comprise a different crystallinity (e.g., larger grain size) than the unaltered region 34, and/or may comprise a lower contaminant concentration (e.g., a lower concentration of one or both of fluorine and boron) relative to the unaltered region 34.

The processing of FIG. 8 may be considered to illustrate an iterative process for forming the conductive structure 30. Specifically, the process stages (A) and (B) show a first iteration for forming a first portion of the conductive structure 30, and the process stages (C) and (D) show a second iteration for forming a second portion of the conductive structure. Each of the iterations includes a treatment (T). Although two iterations are shown, it is to be understood that a process may comprise any suitable number of iterations to form a conductive structure to have any suitable thickness and combination of compositions. Accordingly, in other embodiments three or more of the illustrated iterations may be utilized form a conductive structure.

The methodology of FIGS. 5-8 may be utilized to form conductive components (e.g., wordlines, bitlines, etc.) of integrated assemblies. FIGS. 9-16 illustrate example applications in which the methodology is utilized to form conductive components of three-dimensional NAND.

Figure 9:
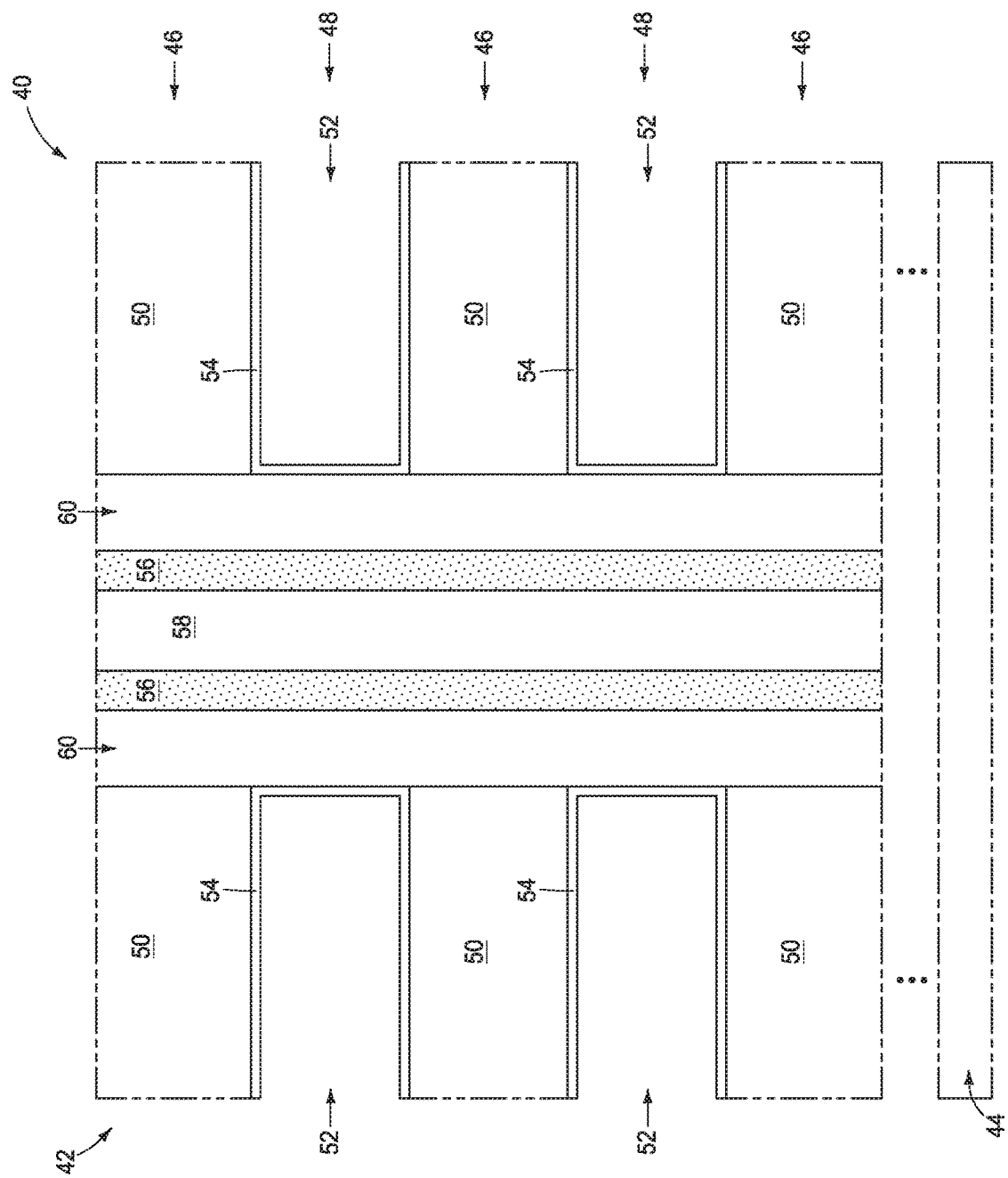
FIG. 9 is a diagrammatic cross-sectional side view of a portion of an integrated assembly.

Referring to FIG. 9, an assembly 40 includes an arrangement 42 supported over a base 44. The base 44 may comprise a semiconductor substrate. A gap is provided between the arrangement 42 and the base 44 to indicate that other materials and structures may be provided between the arrangement 42 and the base 44.

The arrangement 42 includes alternating levels 46 and 48.

The levels 46 may be referred to as insulative levels, and include an insulative material 50.

The levels 48 include voids 52 at the process stage of FIG. 9. Such voids are lined with high-k dielectric material 54 (e.g., aluminum oxide). The term high-k means a dielectric constant greater than that of silicon dioxide. The dielectric material 54 may be referred to as dielectric barrier material.

Channel material 56 extends through the levels 46 and 48. The channel material 56 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Although the channel material appears to be configured as two spaced-apart segments along the cross-section of FIG. 9, it is to be understood that such segments may be part of a single structure. For instance, the channel material 56 may be configured as an annular ring when viewed from above.

A dielectric material 58 fills a "hollow" between the illustrated segments of the channel material 56. The shown embodiment may be considered to be a hollow-channel configuration. In other embodiments, the channel material 56 may be a solid pillar rather than the annular ring.

A region 60 is outward of the channel material 56. Such region may comprise tunneling material (gate dielectric material), charge-storage material and charge-blocking material (none of which are specifically delineated in FIG. 9). The tunneling material, charge-storage material and charge-blocking material may comprise any configurations suitable for being incorporated into NAND memory cells.

The arrangement 42 of FIG. 9 may be formed with any suitable processing. For instance, sacrificial material (not shown) may be initially provided within the levels 48, and may be removed subsequent to the formation of the channel material 56 to form the voids 52. Such voids may then be lined with the dielectric barrier material 54.

Figure 10:
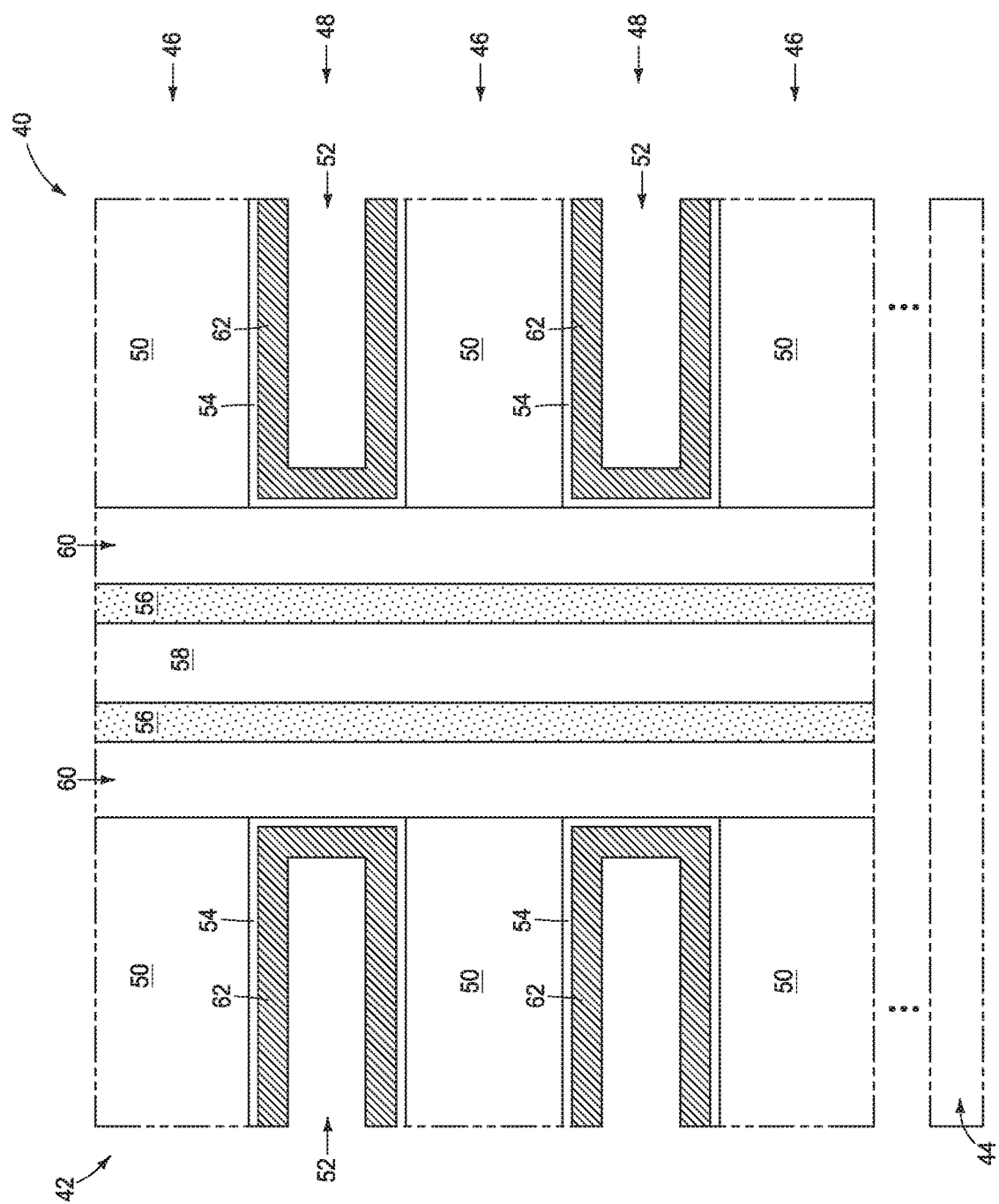
FIG. 10 is a diagrammatic cross-sectional side view of the portion of the integrated assembly of FIG. 9 at a process stage following that of FIG. 9.

Referring to FIG. 10, a first conductive material 62 is provided within the voids 52 to narrow the voids. The first conductive material 62 may be a metal-containing material, and may be referred to as a first metal-containing material. The conductive material 62 may comprise any suitable composition(s). In some embodiments, the first conductive material 62 may be a metal nitride; and may, for example, comprise, consist essentially of, or consist of titanium nitride, tungsten nitride, etc.

Figure 11:
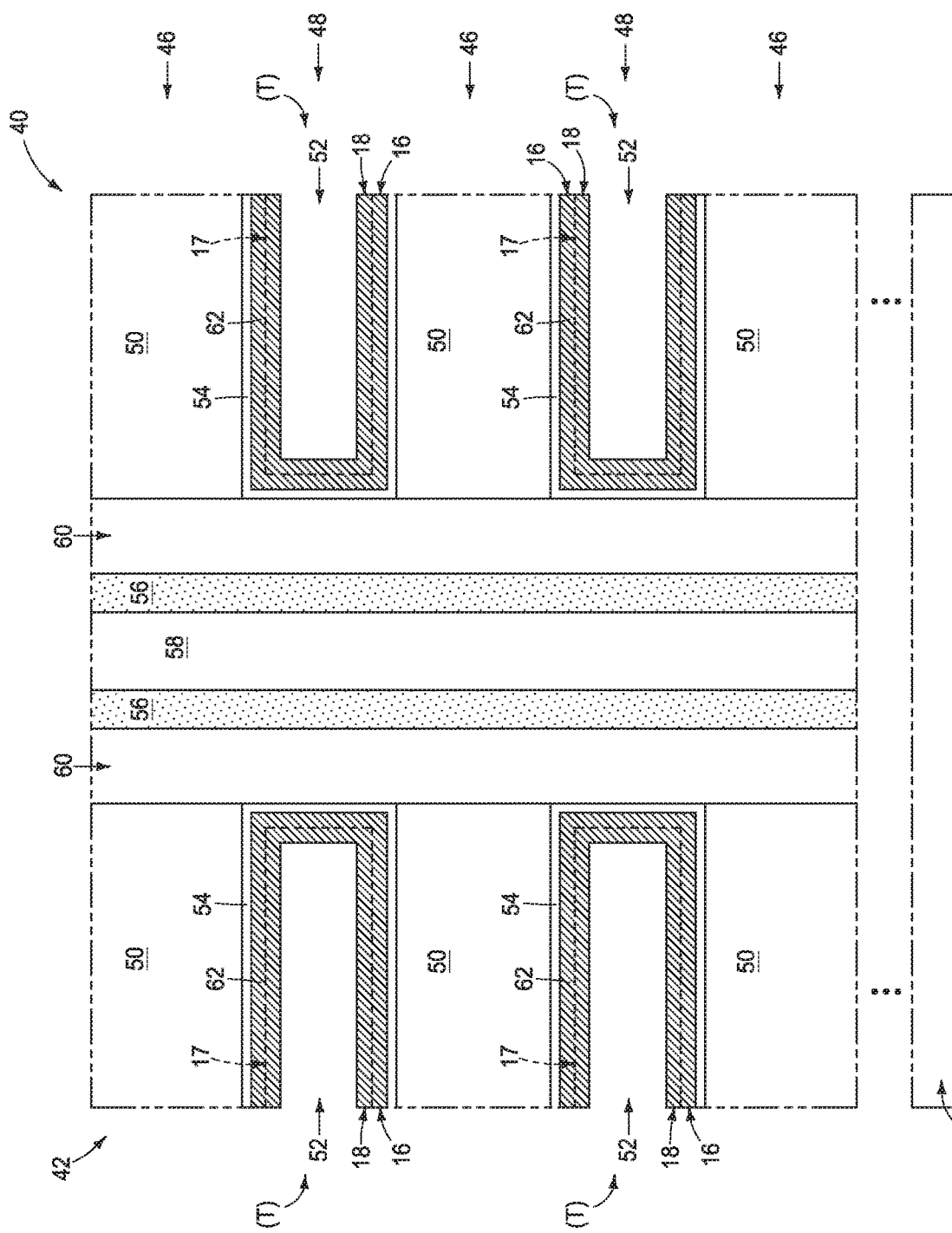
FIG. 11 is a diagrammatic cross-sectional side view of the portion of the integrated assembly of FIG. 9 at a process stage following that of FIG. 10.

Referring to FIG. 11, the first metal-containing material 62 is exposed to the treatment conditions described above with reference to FIG. 5 as the conditions (T). Specifically, the conductive material 62 is exposed to reductant (e.g., hydrogen radical) and oxidant (e.g., one or both of diatomic oxygen and ozone). The exposure forms an altered region 18 of the conductive material 62, while leaving an unaltered region 16. The altered region 18 may comprise a lower contaminant concentration and/or a larger grain size than the unaltered region, as described above with reference to FIGS. 5-7.

Figure 12:
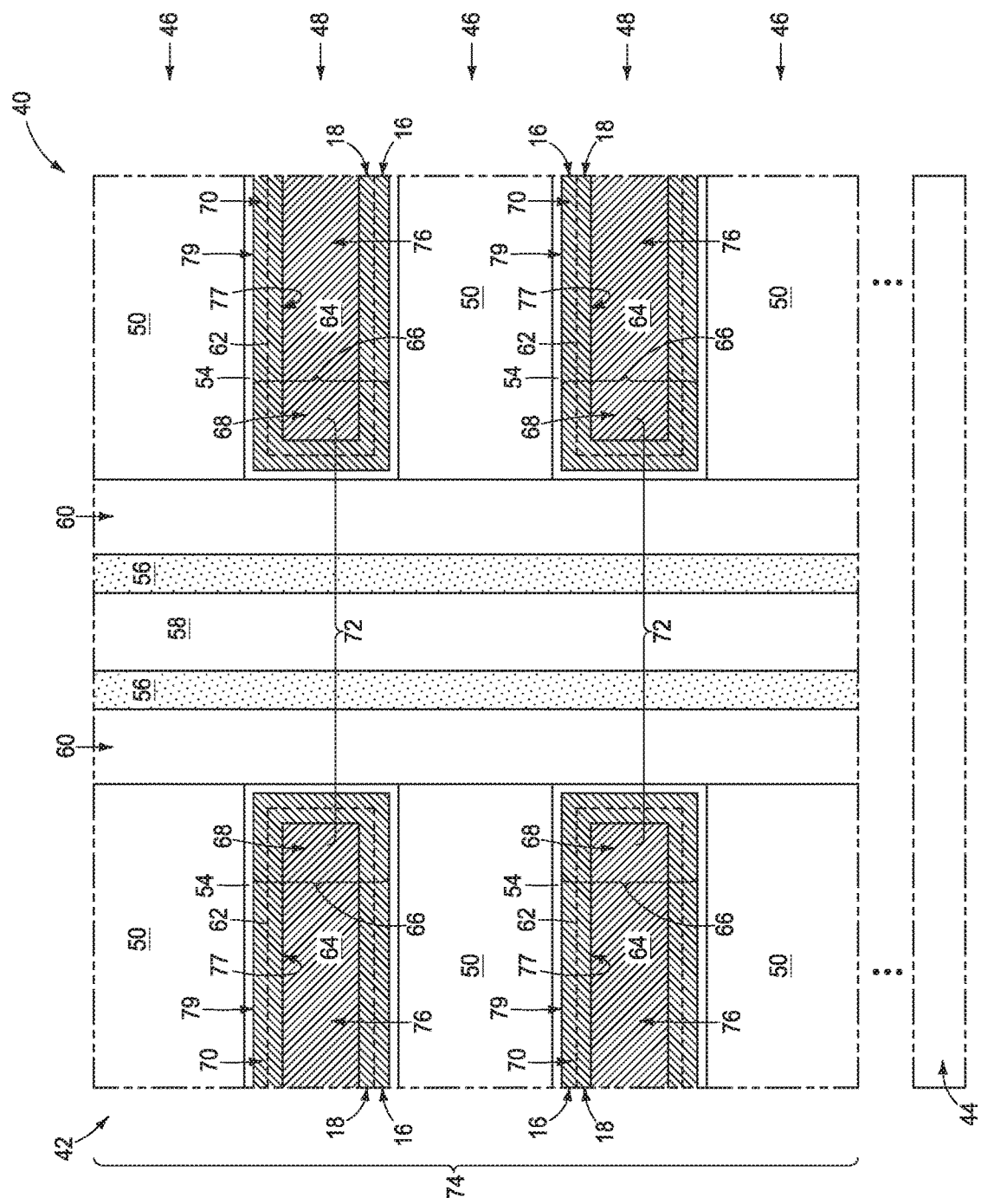
FIG. 12 is a diagrammatic cross-sectional side view of the portion of the integrated assembly of FIG. 9 at a process stage following that of FIG. 11.

Referring to FIG. 12, a second conductive material 64 is formed within the voids 52 (FIG. 11) to fill the voids. The second conductive material 64 may be a metal-containing material, and may be referred to as a second metal-containing material. The second conductive material 64 may comprise any suitable composition(s); and in some embodiments may comprise, consist essentially of, or consist of one or more metals (e.g., may comprise, consist essentially of, or consist of tungsten). In some embodiments, the first metal-containing material 62 may be utilized as a seed material to promote growth of the second metal-containing material 64, and/or may be utilized to provide adhesion to both the second metal-containing material 64 and the dielectric barrier material 54.

The conductive materials 62 and 64 together form conductive structures 66. Such conductive structures may be considered to comprise control gate regions 68 proximate the channel material 56, and to comprise wordline regions 70 adjacent the control gate regions 68. The wordline regions 70 may be considered to be comprised by wordlines of a three-dimensional NAND configuration.

NAND memory cells 72 may comprise the control gate regions 68 together with portions of the channel material 56 and the materials within the regions 60 (i.e., the gate dielectric material, charge-blocking material and charge-storage material). The NAND memory cells 72 are vertically stacked one atop another. Although two NAND memory cells are shown, it is to be understood that there may be many more than two memory cells in a vertical stack. For instance, there may be 8 memory cells, 16 memory cells, 32 memory cells, 64 memory cells, 128 memory cells, etc., in a vertical stack. The illustrated vertical stack of memory cells may be representative of a large number of vertical stacks formed across a NAND memory array.

In some embodiments, the levels 48 may be considered to be conductive levels (e.g., NAND wordline levels) at the process stage of FIG. 12. Such conductive levels may be considered to alternate with the insulative levels 46 within a stack 74. The conductive levels 48 may be considered to be substantially identical to one another; where the term "substantially identical" means identical to within reasonable tolerances of fabrication and measurement.

In some embodiments, the conductive material 64 may be considered to correspond to metal-containing cores 76 of the conductive structures 66, and such cores may be considered to be at least partially-surrounded by the first metal-containing material 62. Each metal-containing core 76 may be considered to be directly adjacent the first metal-containing material 62, and to join to the first metal-containing material 62 along an interface (interface region) 77. The metal-containing material 62 includes a surface 79 (which may be referred to as a second surface) which is offset from the interface 77. A contaminant concentration within the material 62 (with example contaminant comprising one or both of fluorine and boron) may be decreased in the region 18 relative to the region 16. In some embodiments, a gradient of the contaminant concentration may increase in a direction from the interface 77 to the second surface 79, with such increase being analogous to the increasing contaminant concentration [X] described above with reference to FIG. 7. In some embodiments, a crystalline grain size within the metal-containing material 62 may be larger along the interface 77 that along the second surface 79; with such difference in grain size being analogous to difference in grain size described above with reference to FIG. 6 relative to the regions 16 and 18. In some embodiments, the altered region 18 may have a larger grain size than the unaltered region 16 of the metal-containing material 62, and/or may have a lower concentration of contaminant (e.g., a lower concentration of one or both of fluorine and boron) than the unaltered region 16.

The embodiment of FIGS. 10 and 11 shows the first metal-containing material 62 being exposed to the treatment conditions (T) to form the region 18. In other embodiments, the second metal-containing material 64 may be exposed to the treatment conditions.

Figure 13:
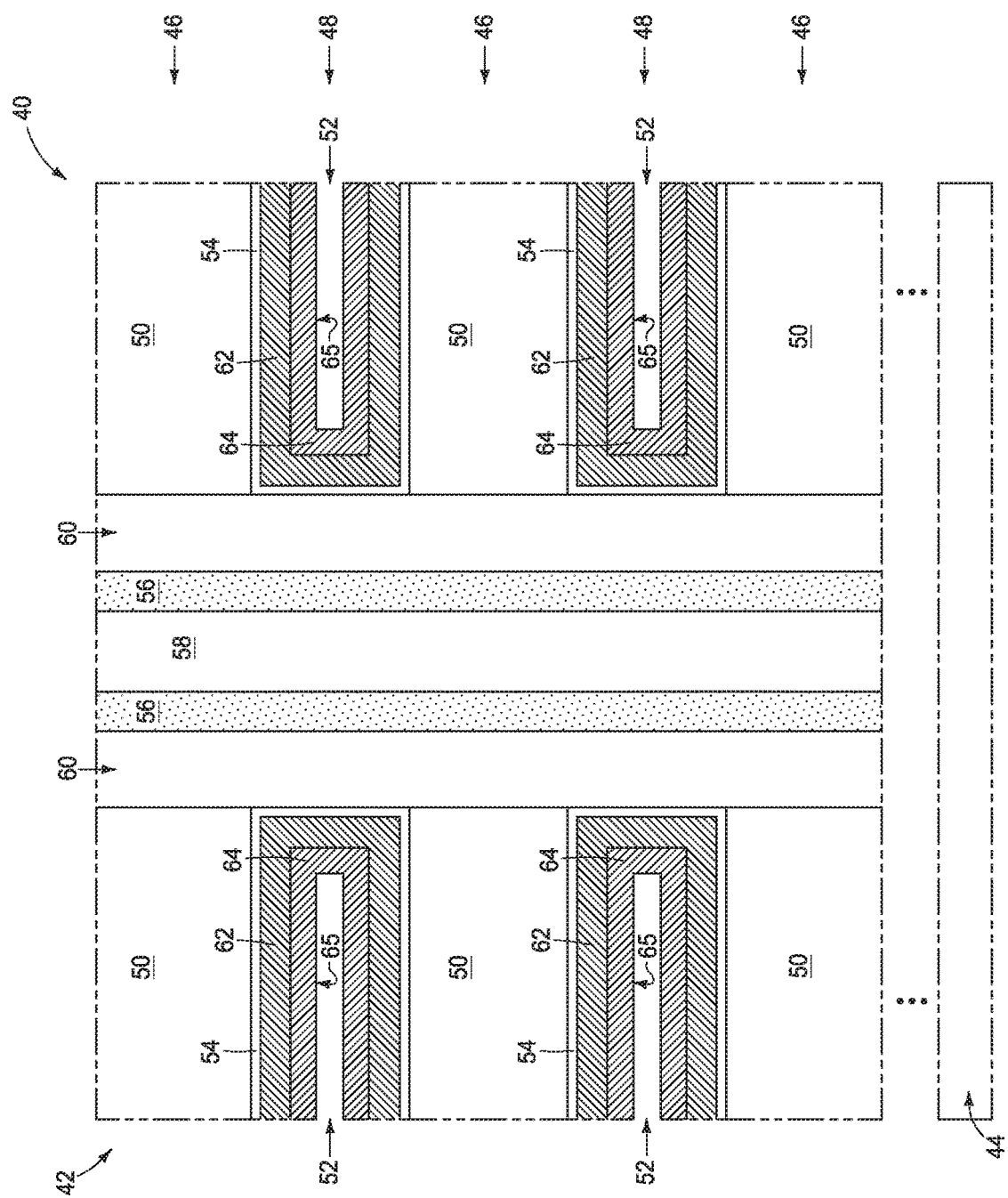
FIG. 13 is a diagrammatic cross-sectional side view of the portion of the integrated assembly of FIG. 9 at a process stage following that of FIG. 10.

FIG. 13 shows the assembly 40 at a process stage which may follow that of FIG. 10. A first portion of the conductive material 64 is formed within the voids 52 to partially fill the voids. The first portion has an exposed surface 65 within the voids 52.

Figure 14:
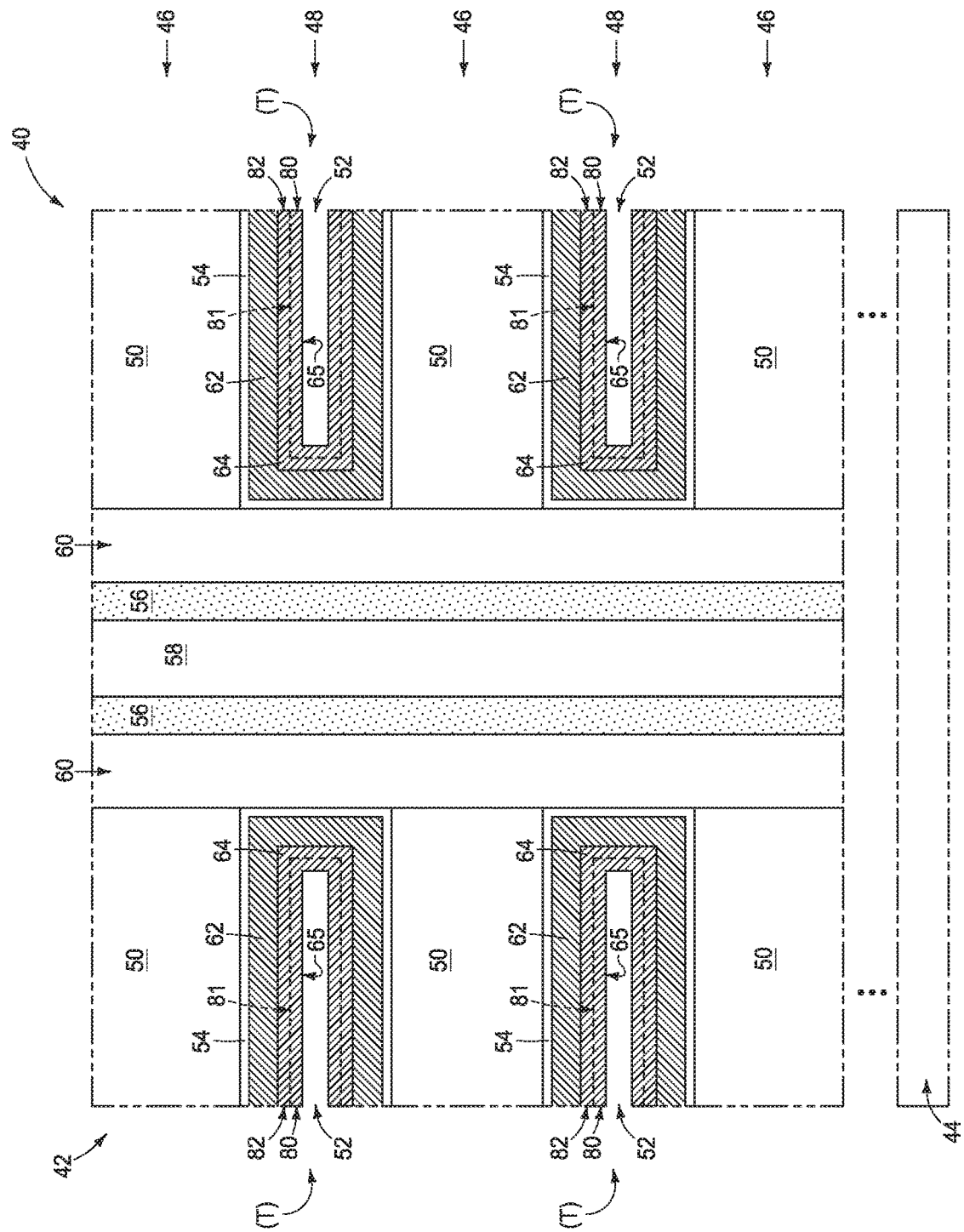
FIG. 14 is a diagrammatic cross-sectional side view of the portion of the integrated assembly of FIG. 9 at a process stage following that of FIG. 13.

Referring to FIG. 14, the exposed surface 65 is exposed to the treatment conditions (T) described above with reference to FIG. 5 to form altered regions 80 while leaving unaltered regions 82. A dashed line 81 is provided to diagrammatically illustrate an approximate boundary between the altered regions 80 and the unaltered regions 82.

Figure 15:
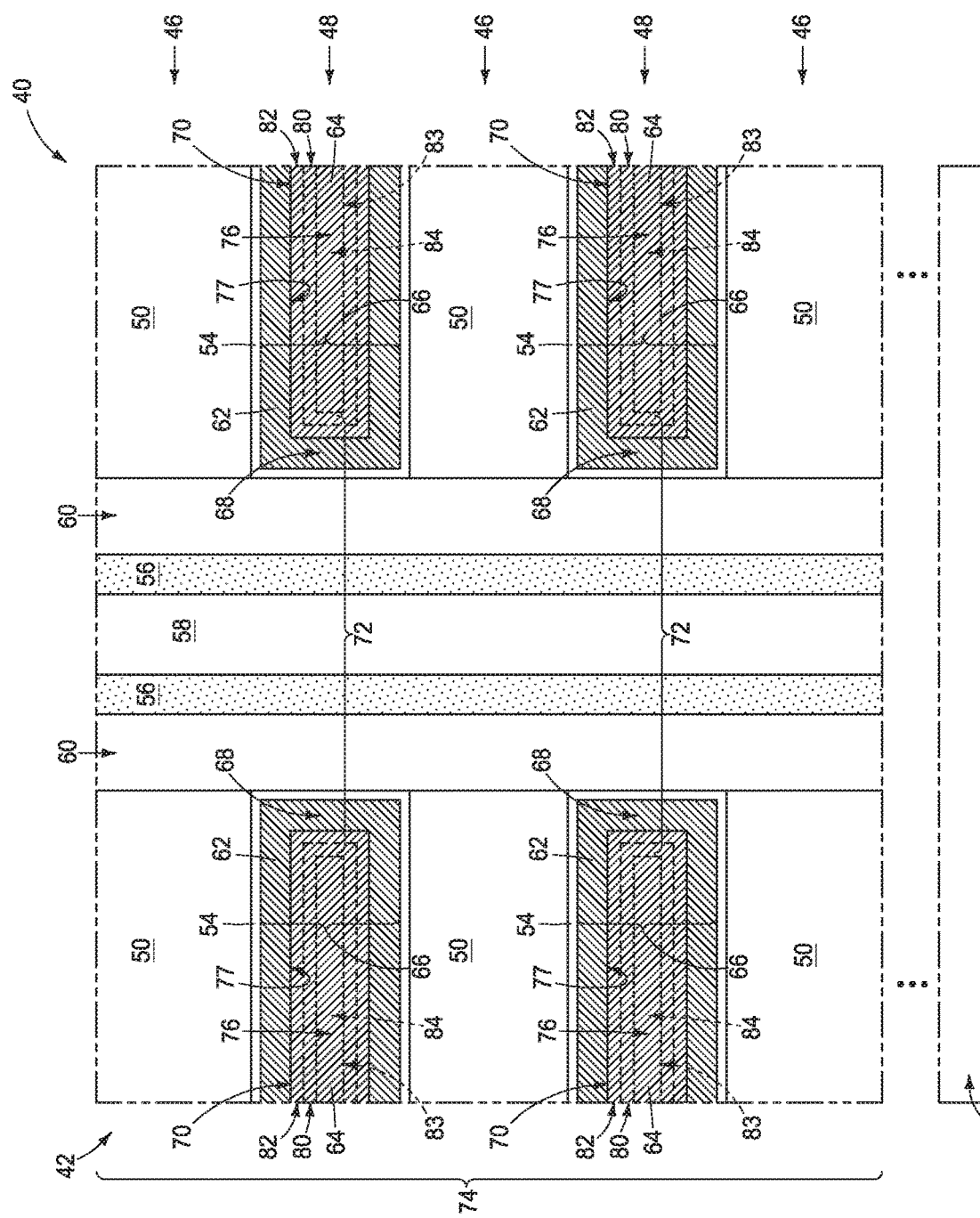
FIG. 15 is a diagrammatic cross-sectional side view of the portion of the integrated assembly of FIG. 9 at a process stage following that of FIG. 14.

Referring to FIG. 15, additional conductive material 64 is provided within the voids 52 (FIG. 14) to fill the voids, and to thereby form the conductive cores 76. Dashed lines 83 are provided to diagrammatically illustrate regions where the second portions of the conductive material 64 joined to the first portions of the conductive material 64 (with such first portions having been shown in FIG. 14).

The conductive cores 76 join to the first metal-containing material 62 along the interfaces 77. In some embodiments, the conductive core 76 comprises a contaminant, and a concentration of the contaminant increases in a direction toward the interface 77 (i.e., is higher in the unaltered region 82 than in the altered region 80). In some embodiments, the conductive core comprises a larger grain size in a region displaced from the interface 77 relative to a region directly adjacent to the interface 77 (i.e., comprises a larger grain size in the region 80 than in the region 82). The portions of the conductive material 64 provided subsequent to the treatment shown at the process stage of FIG. 14 (the second portions of the conductive material 64) may have a grain size approximately the same as that of the unaltered regions 82 and/or may have a contaminant concentration approximately the same as that of the unaltered regions 82.

The configuration of FIG. 15 comprises conductive structures 66 analogous to those described above with reference to FIG. 12. Such conductive structures have control gate regions 68 and wordline regions 70, and may comprise NAND wordlines of a three-dimensional NAND configuration. The assembly 40 of FIG. 15 also comprises vertically-stacked NAND memory cells 72 analogous to those described above with reference to FIG. 12.

Figure 16:
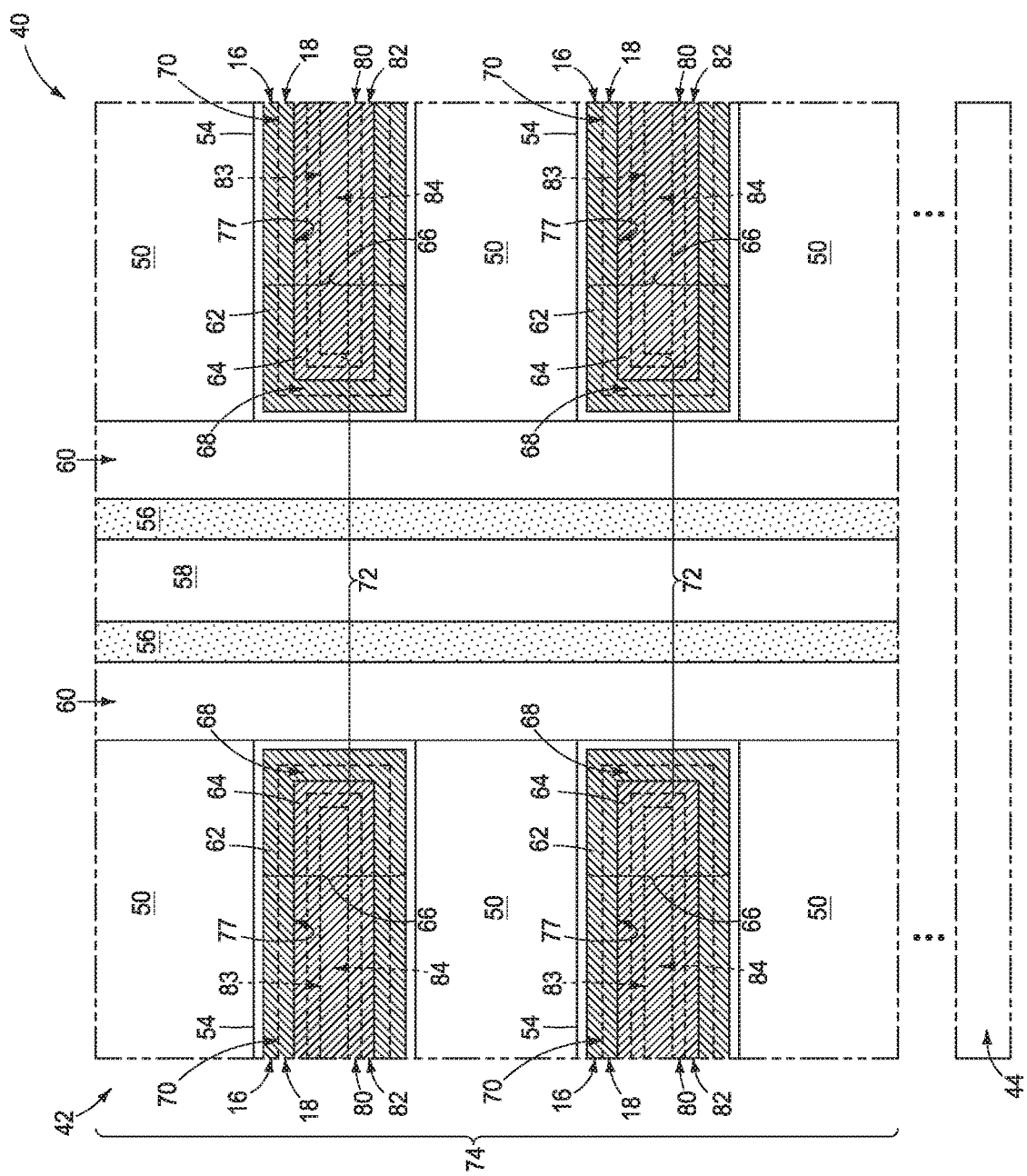
FIG. 16 is a diagrammatic cross-sectional side view of the portion of the integrated assembly of FIG. 9 at a process stage following that of FIG. 11.

In some embodiments, the outer conductive material 62 and the core conductive material 64 may both be treated with the treatment process (T) described above with reference to FIG. 5. In other words, the process stage of FIG. 14 may follow the process stage of FIG. 11. In such embodiments, the treatment of FIG. 11 may be considered to be a first exposure to the conditions of the treatment process (T), and the treatment of FIG. 14 may be considered to be a second exposure to such conditions. FIG. 16 shows assembly 40 in a configuration in which both the first and second metal-containing materials 62 and 64 have been subjected to the treatment process (T). The material 62 comprises the altered regions 18 and the unaltered regions 16, and the material 64 comprises the altered regions 80 and the unaltered regions 82.

The assembly 40 of FIG. 16 comprises vertically-stacked NAND memory cells 72 analogous to those described above with reference to FIG. 12, and may be considered to be another example of a three-dimensional NAND arrangement.

Figure 17:
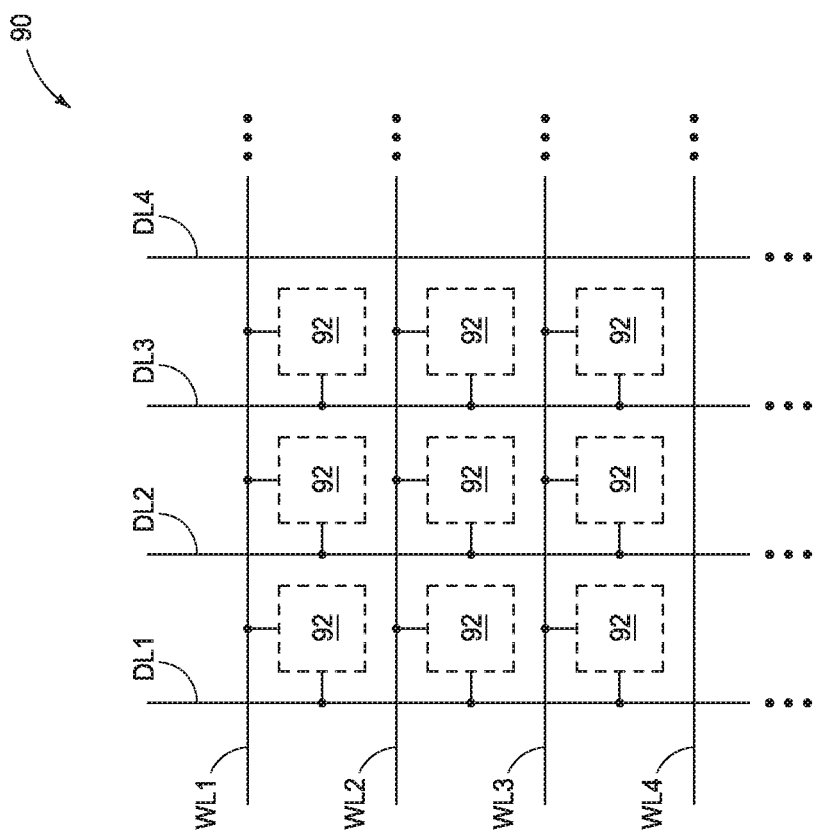
FIG. 17 is a diagrammatic schematic view of a portion of an example integrated memory array.

The modified conductive structures (e.g., the conductive structures 24 of FIG. 5 and FIG. 8, and the conductive structures 66 of FIGS. 12, 15 and 16) may be considered to be example conductive structures which may be utilized within integrated circuitry. The conductive structures may be utilized for numerous conductive components of integrated circuitry, and in some embodiments may be incorporated into wordlines and/or bitlines. The wordlines and/or bitlines may be utilized within NAND memory arrays of the types described with reference to FIGS. 1-4; with example NAND memory arrays being the three-dimensional arrays shown in FIGS. 12, 15 and 16. The wordlines and/or bitlines may also be utilized in other types of memory arrays; such as, for example, DRAM (dynamic random-access memory) arrays. An example DRAM array 90 is schematically illustrated in FIG. 17. The memory array 90 comprises a plurality of memory cells 92. The illustrated memory cells are representative of a large number of memory cells which may be provided within a memory array. In practice, the memory array may comprise hundreds, thousands, millions, hundreds of millions, etc., of memory cells. The memory cells 92 may be one-transistor one-capacitor (1T-1C) memory cells, or may be any other suitable memory cells.

The memory array 90 includes a series of wordlines, WL1-WL4, and a series of bitlines (digit lines), DL1-DL4.

In the shown embodiment, each of the memory cells 92 is uniquely addressed with one of the wordlines (WL1-WL4) and one of the digit lines (DL1-DL4). In some embodiments, the wordlines may be coupled with driver circuitry (e.g., wordline-driver-circuitry), and the digit lines (bitlines) may be coupled with sense-amplifier-circuitry.

In some applications, the wordlines (WL1-WL4) and/or the digit lines (DL1-DL4) may include treated metal-containing materials formed in accordance with the methodology described herein (e.g., the methodology described above with reference to FIGS. 5-8).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming a conductive structure. A metal-containing conductive material is formed over a supporting substrate. A surface of the metal-containing conductive material is exposed to at least one radical form of hydrogen and to at least one oxidant. The exposure alters at least a portion of the metal-containing conductive material to thereby form at least a portion of the conductive structure.

Some embodiments include an assembly comprising a metal-containing conductive material having a first region adjacent a second region. The first region has a smaller average grain size per unit area relative to the second region. The conductive structure is within a conductive level. The conductive level is one of many substantially identical conductive levels within a stack having insulative levels alternating with the conductive levels.

Some embodiments include a conductive structure which has a metal-containing conductive material with a first region adjacent to a second region. The first region has a greater concentration of one or both of fluorine and boron relative to the second region.

Some embodiments include an integrated assembly having a conductive structure supported by a semiconductor substrate. The conductive structure includes a metal-containing conductive material which has a first region adjacent to a second region. The first region has a different crystallinity relative to the second region, and has a greater concentration of one or both of fluorine and boron relative to the second region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a conductive structure, comprising:

forming a metal-containing conductive material over a supporting substrate; and exposing a surface of the metal-containing conductive material to at least one radical form of hydrogen and to at least one oxidant; the exposing altering at least a portion of the metal-containing conductive material to thereby form at least a portion of the conductive structure;

wherein the metal-containing conductive material is a first conductive material, and wherein the exposing is a first exposing; and further comprising:

forming a second conductive material directly against the surface after the first exposing; and exposing a surface of the second conductive material to the least one radical form of hydrogen and to the at least one oxidant to alter at least a portion of the second conductive material.

2. The method of claim 1 wherein the first conductive material includes titanium and nitrogen, and wherein the second conductive material comprises tungsten.

3. The method of claim 1 wherein the metal-containing conductive material includes one or more of tungsten, titanium, cobalt, nickel, molybdenum, niobium, ruthenium, tantalum, copper and aluminum.

4. The method of claim 3 wherein the metal-containing conductive material includes one or more non-metal constituents selected from the group consisting of nitrogen, silicon, germanium, boron and carbon.

* * * * *